(12) United States Patent
Yang et al.

(10) Patent No.: US 11,652,097 B2
(45) Date of Patent: May 16, 2023

(54) TRANSIENT VOLTAGE SUPPRESSION DEVICE

(71) Applicant: AMAZING MICROELECTRONIC CORP., New Taipei (TW)

(72) Inventors: Tun-Chih Yang, New Taipei (TW); Zi-Ping Chen, New Taipei (TW); Kun-Hsien Lin, Hsinchu (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 242 days.

(21) Appl. No.: 17/107,003

(22) Filed: Nov. 30, 2020

(65) Prior Publication Data
US 2022/0173093 A1    Jun. 2, 2022

(51) Int. Cl.
*H01L 27/02*    (2006.01)

(52) U.S. Cl.
CPC ...... *H01L 27/0262* (2013.01); *H01L 27/0296* (2013.01)

(58) Field of Classification Search
CPC .................................................. H01L 27/0262
See application file for complete search history.

(56) References Cited

U.S. PATENT DOCUMENTS

| | | | |
|---|---|---|---|
| 6,476,422 B1 * | 11/2002 | Yu | H01L 27/0262 257/362 |
| 2003/0102485 A1 | 6/2003 | Chen et al. | |
| 2019/0103396 A1 * | 4/2019 | Zhan | H01L 29/0821 |

FOREIGN PATENT DOCUMENTS

TW    I349368 B    9/2011

* cited by examiner

*Primary Examiner* — Matthew C Landau
*Assistant Examiner* — Mark Hatzilambrou
(74) *Attorney, Agent, or Firm* — Birch, Stewart, Kolasch & Birch, LLP (57) ABSTRACT

A transient voltage suppression device includes a P-type semiconductor layer, a first N-type well, a first N-type heavily-doped area, a first P-type heavily-doped area, a second P-type heavily-doped area, and a second N-type heavily-doped area. The first N-type well and the second N-type heavily-doped area are formed in the layer. The first P-type heavily-doped area is formed in the first N-type well. The first P-type heavily-doped area is spaced from the bottom of the first N-type well. The second P-type heavily-doped area is formed within the first N-type well and spaced from the sidewall of the first N-type well. The second P-type heavily-doped area is formed between the first P-type heavily-doped area and the second N-type heavily-doped area.

12 Claims, 7 Drawing Sheets

TRANSIENT VOLTAGE SUPPRESSION DEVICE

BACKGROUND OF THE INVENTION

Field of the Invention

The present invention relates to a suppression device, particularly to a transient voltage suppression device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

Figure 1:
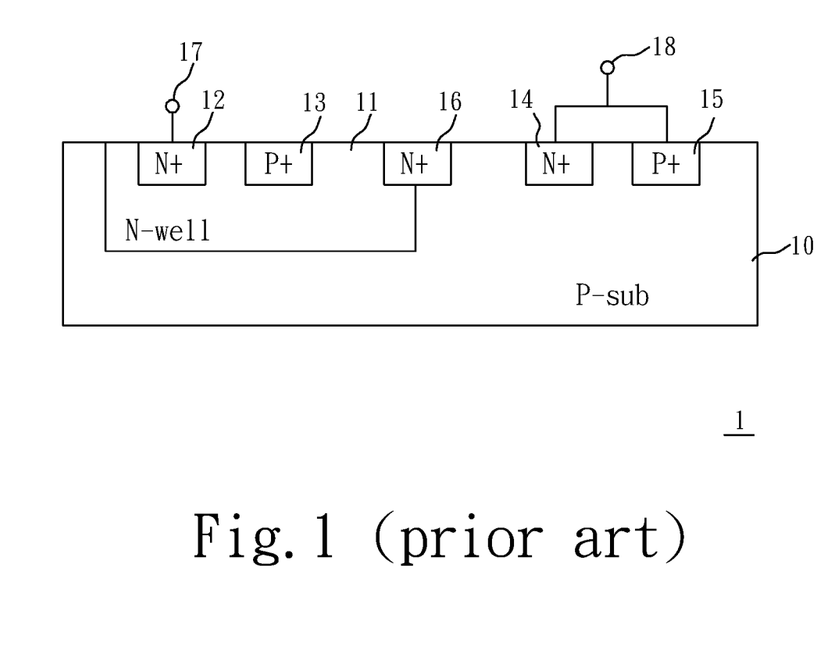
FIG. 1 is a schematic diagram illustrating an ESD protection device in the conventional technology.

The working principle of an ESD protection device 1 is shown in FIG. 1. In FIG. 1, the ESD protection device 1 includes a P-type semiconductor substrate 10. An N-type well 11 is formed in the P-type semiconductor substrate 10. An N-type heavily-doped area 12 and a P-type heavily-doped area 13 are formed in the N-type well 11. An N-type heavily-doped area 14 and a P-type heavily-doped area 15 are formed in the P-type semiconductor substrate 10. An N-type heavily-doped area 16 is formed in the N-type well 11 and the P-type semiconductor substrate 10. The N-type heavily-doped area 12 is coupled to a first pin 17. The N-type heavily-doped area 14 and the P-type heavily-doped area 15 are coupled to a second pin 18. The N-type well 11, the P-type heavily-doped area 13, the P-type semiconductor substrate 10, the N-type heavily-doped area 16, and the N-type heavily-doped area 14 form a parasitic silicon-controlled rectifier (SCR). The breakdown voltage of the ESD protection device 1 depends on the trigger voltage of the SCR. The trigger voltage of the SCR depends on the breakdown voltage of an interface between the P-type semiconductor substrate 10 and the N-type heavily-doped area 16. However, a junction capacitance formed by the P-type semiconductor substrate 10 and the N-type heavily-doped area 16 is relatively large. Thus, the breakdown voltage of the ESD protection device 1 is relatively reduced to degrade the ESD protection effect. Besides, since the P-type heavily-doped area 13 is disconnected from the first pin 17, the ESD current flows through the N-type well 11 whose series resistance is larger. This can also degrade the ESD protection effect.

To overcome the abovementioned problems, the present invention provides a transient voltage suppression device, so as to solve the afore-mentioned problems of the prior art.

SUMMARY OF THE INVENTION

The present invention provides a transient voltage suppression device, which reduces the capacitance of the parasitic silicon-controlled rectifier and the series resistance of the breakdown path, thereby improving the electrostatic discharge (ESD) protection effect.

In an embodiment of the present invention, a transient voltage suppression device includes a P-type semiconductor layer, a first N-type well, a first N-type heavily-doped area, a first P-type heavily-doped area, a second P-type heavily-doped area, and a second N-type heavily-doped area. The first N-type well is formed in the P-type semiconductor layer. The first N-type heavily-doped area and the first P-type heavily-doped area are formed in the first N-type well and commonly coupled to a first pin. The first P-type heavily-doped area is spaced from the bottom of the first N-type well. The second P-type heavily-doped area is formed within the first N-type well and spaced from the sidewall of the first N-type well. The second P-type heavily-doped area is floating. The second N-type heavily-doped area is formed in the P-type semiconductor layer and coupled to a second pin. The second P-type heavily-doped area is formed between the first P-type heavily-doped area and the second N-type heavily-doped area.

In an embodiment of the present invention, a first distance between the second P-type heavily-doped area and the sidewall of the first N-type well is less than a second distance between the first P-type heavily-doped area and the bottom of the first N-type well.

In an embodiment of the present invention, the transient voltage suppression device further includes a third N-type heavily-doped area formed within the first N-type well. The third N-type heavily-doped area is floating and directly adjacent to the second P-type heavily-doped area. The third N-type heavily-doped area is formed between the first P-type heavily-doped area and the second P-type heavily-doped area.

In an embodiment of the present invention, the transient voltage suppression device further includes a third P-type heavily-doped area formed in the P-type semiconductor layer and coupled to the second pin.

In an embodiment of the present invention, the transient voltage suppression device further includes a second N-type well formed in the P-type semiconductor layer. The second N-type heavily-doped area and the third P-type heavily-doped area are formed in the second N-type well.

In an embodiment of the present invention, the transient voltage suppression device further includes a fourth P-type heavily-doped area formed within the second N-type well and spaced from a sidewall of the second N-type well. The fourth P-type heavily-doped area is floating. The fourth P-type heavily-doped area is formed between the third P-type heavily-doped area and the first N-type heavily-doped area. The third P-type heavily-doped area is spaced from a bottom of the second N-type well.

In an embodiment of the present invention, a third distance between the fourth P-type heavily-doped area and the sidewall of the second N-type well is less than a fourth distance between the third P-type heavily-doped area and the bottom of the second N-type well.

In an embodiment of the present invention, the transient voltage suppression device further includes a fourth N-type heavily-doped area formed within the second N-type well. The fourth N-type heavily-doped area is floating and directly adjacent to the fourth P-type heavily-doped area, and the fourth N-type heavily-doped area is formed between the third P-type heavily-doped area and the fourth P-type heavily-doped area.

In an embodiment of the present invention, a distance between the second P-type heavily-doped area and the sidewall of the first N-type well is equal to a distance between the fourth P-type heavily-doped area and the sidewall of the second N-type well.

In an embodiment of the present invention, a distance between the first P-type heavily-doped area and the bottom of the first N-type well is equal to a distance between the third P-type heavily-doped area and the bottom of the second N-type well.

In an embodiment of the present invention, the P-type semiconductor layer is a P-type semiconductor substrate or a P-type epitaxial layer.

In an embodiment of the present invention, the P-type semiconductor layer is a P-type semiconductor substrate or a P-type epitaxial layer.

In an embodiment of the present invention, the transient voltage suppression device further includes a P-type well formed in the P-type semiconductor layer. The second N-type heavily-doped area is formed in the P-type well.

In an embodiment of the present invention, the transient voltage suppression device further includes a third P-type heavily-doped area formed in the P-type well and coupled to the second pin.

To sum up, the transient voltage suppression device forms the second P-type heavily-doped area within the first N-type well and separates the second P-type heavily-doped area from the sidewall of the first N-type well to reduce the capacitance of the parasitic silicon-controlled rectifier. The transient voltage suppression device also connects the first N-type heavily-doped area and the second P-type heavily-doped area within the N-type well to reduce the series resistance of the breakdown path. Thus, the transient voltage suppression device improves the ESD protection effect.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

For the purpose of reducing the capacitance of the parasitic silicon-controlled rectifier and the series resistance of the breakdown path, a transient voltage suppression device is provided.

Figure 2:
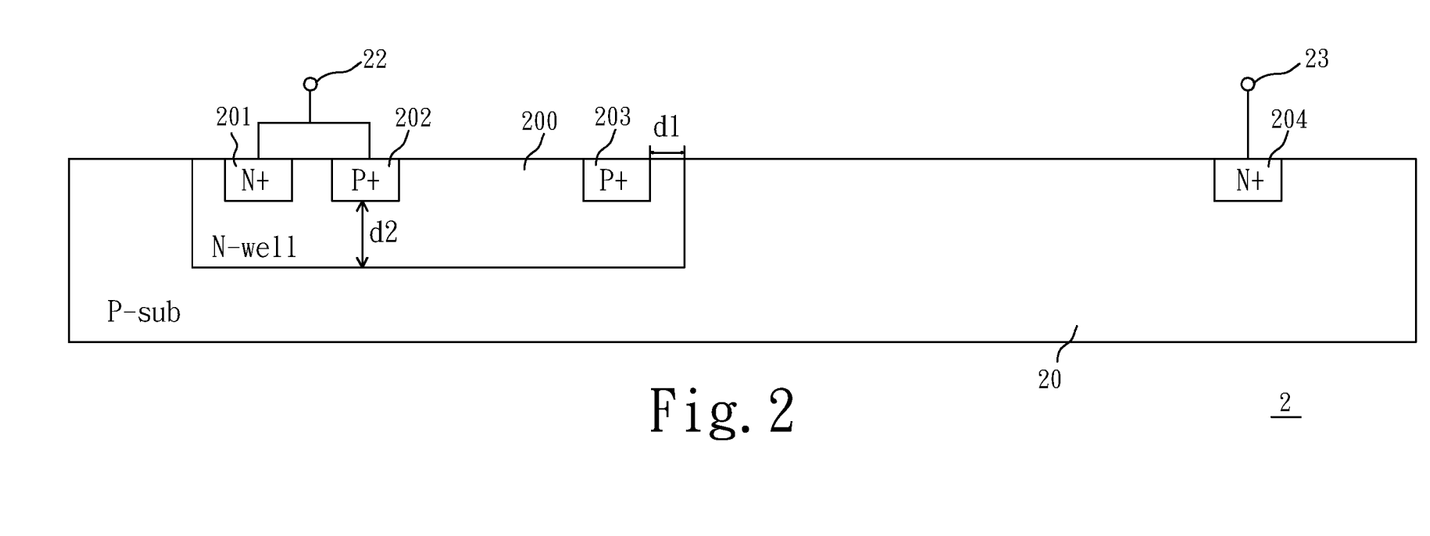
FIG. 2 is a cross-sectional view of a transient voltage suppression device according to a first embodiment of the present invention.

FIG. 2 is a cross-sectional view of a transient voltage suppression device according to a first embodiment of the present invention. Referring to FIG. 2, the first embodiment of the transient voltage suppression device 2 includes a P-type semiconductor layer 20, a first N-type well 200, a first N-type heavily-doped area 201, a first P-type heavily-doped area 202, a second P-type heavily-doped area 203, and a second N-type heavily-doped area 204. The first N-type well 200 is formed in the P-type semiconductor layer 20. The P-type semiconductor layer 20 may be a P-type semiconductor substrate or a P-type epitaxial layer, but the present invention is not limited thereto. The first embodiment exemplifies the P-type semiconductor substrate as the P-type semiconductor layer 20. The first N-type heavily-doped area 201 and the first P-type heavily-doped area 202 are formed in the first N-type well 200 and commonly coupled to a first pin 22. The first N-type heavily-doped area 201 is used to provide the voltage of the first pin 22 for the first N-type well 200. The first P-type heavily-doped area 202 is spaced from the bottom of the first N-type well 200. The second P-type heavily-doped area 203 is formed within the first N-type well 200 and spaced from the sidewall of the first N-type well 200. The second P-type heavily-doped area 203 is floating. The second N-type heavily-doped area 204 is formed in the P-type semiconductor layer 20 and coupled to a second pin 23. The second P-type heavily-doped area 203 is formed between the first P-type heavily-doped area 202 and the second N-type heavily-doped area 204. The first P-type heavily-doped area 202, the first N-type well 200, the P-type semiconductor layer 20, and the second N-type heavily-doped area 204 form a first parasitic silicon-controlled rectifier. The second P-type heavily-doped area 203, the first N-type well 200, and the P-type semiconductor layer 20 form a first parasitic PNP bipolar junction transistor.

When a positive electrostatic discharge (ESD) voltage is applied to the first pin 22 and the second pin 23 is grounded, a ESD current sequentially flows through the first P-type heavily-doped area 202, the first N-type well 200, the P-type semiconductor layer 20, and the second N-type heavily-doped area 204. Simultaneously, the first parasitic PNP bipolar junction transistor can help trigger on the first parasitic silicon-controlled rectifier. Since the ESD current does not flow through the first N-type heavily-doped area 201, the series resistance of the breakdown path where the ESD current flows can be reduced. Besides, since the second P-type heavily-doped area 203 separates from the sidewall of the first N-type well 200, a junction capacitance formed by the P-type semiconductor layer 20 and the first N-type well 200 is lower than the junction capacitance formed by the P-type semiconductor layer 10 and the N-type heavily-doped area 16 of FIG. 1. As a result, the ESD protection effect of the transient voltage suppression device 2 can be improved.

Figure 3:
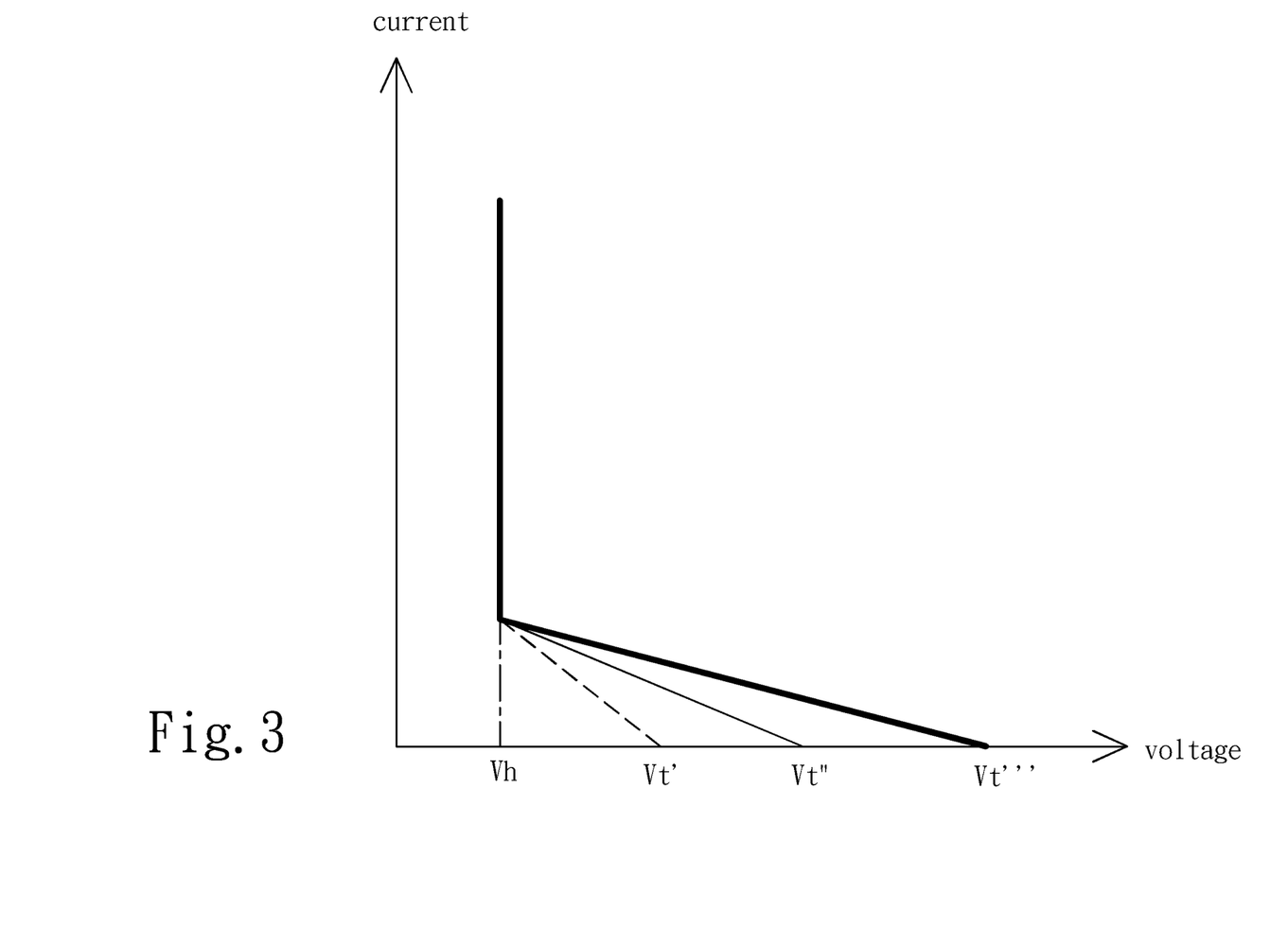
FIG. 3 is a diagram illustrating an I-V curve of a first parasitic silicon-controlled rectifier according to an embodiment of the present invention.

The second P-type heavily-doped area 203 is a first distance d1 from the sidewall of the first N-type well 200. The first P-type heavily-doped area 202 is a second distance d2 from the bottom of the first N-type well 200. The first distance d1 is the width of the base of the first parasitic PNP bipolar junction transistor. The breakdown voltage of the first parasitic PNP bipolar junction transistor depends on the first distance d1. The trigger voltage of the first parasitic silicon-controlled rectifier depends on the breakdown voltage of the first parasitic PNP bipolar junction transistor. FIG. 3 is a diagram illustrating an I-V curve of the first parasitic silicon-controlled rectifier according to an embodiment of the present invention. Referring to FIG. 2 and FIG. 3, the three different trigger voltages Vt', Vt'', and Vt''' of the first parasitic silicon-controlled rectifier respectively correspond to the three different first distances d1. Assume that the first parasitic silicon-controlled rectifier has a holding voltage Vh. The first distance d1 corresponding to the trigger voltage Vt' is less than the first distance d1 corresponding to the trigger voltage Vt''. The first distance d1 corresponding to the trigger voltage Vt'' is less than the first distance d1 corresponding to the trigger voltage Vt'''.

The first P-type heavily-doped area 202, the first N-type well 200, and the P-type semiconductor layer 20 form a second parasitic PNP bipolar junction transistor. The second distance d2 is the width of the base of the second parasitic PNP bipolar junction transistor. The breakdown voltage of the second parasitic PNP bipolar junction transistor depends on the second distance d2. In some embodiments of the present invention, the first distance d1 between the second P-type heavily-doped area 203 and the sidewall of the first N-type well 200 may be less than the second distance d2 between the first P-type heavily-doped area 202 and the bottom of the first N-type well 200. As a result, the speed of turning on the first parasitic PNP bipolar junction transistor is higher than the speed of turning on the second parasitic PNP bipolar junction transistor, such that the speed of turning on the first parasitic silicon-controlled rectifier is increased.

Figure 4:
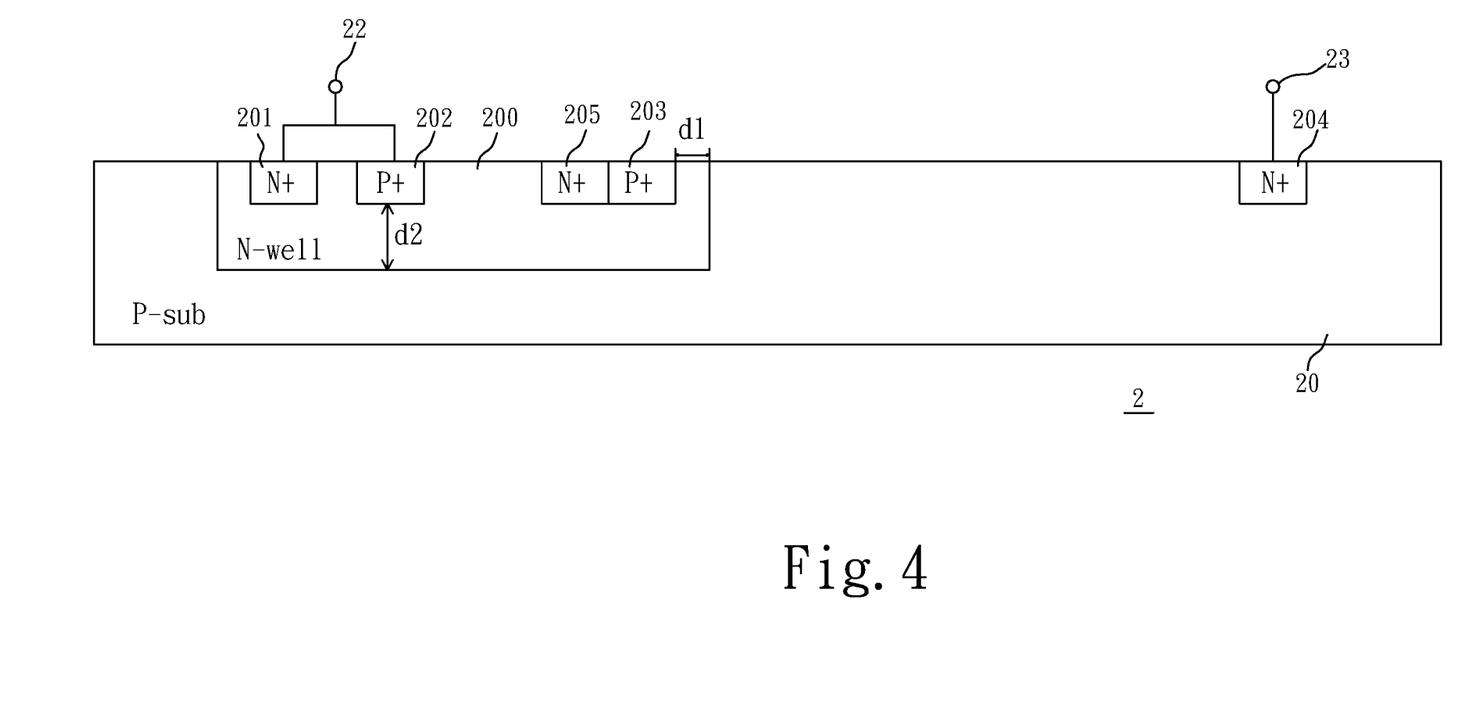
FIG. 4 is a cross-sectional view of a transient voltage suppression device according to a second embodiment of the present invention.

FIG. 4 is a cross-sectional view of a transient voltage suppression device according to a second embodiment of the present invention. Referring to FIG. 4, the second embodiment of the transient voltage suppression device 2 is introduced as follows. The second embodiment is different from the first embodiment in that the second embodiment further includes a third N-type heavily-doped area 205 formed within the first N-type well 200. The third N-type heavily-doped area 205 is floating and directly adjacent to the second P-type heavily-doped area 203. In other words, there is nothing between the third N-type heavily-doped area 205 and the second P-type heavily-doped area 203. The third N-type heavily-doped area 205 is formed between the first P-type heavily-doped area 202 and the second P-type heavily-doped area 203. When the positive ESD voltage is applied to the first pin 22 and the second pin 23 is grounded, the third N-type heavily-doped area 205 can generate a drift current to increase the speed of turning on the first parasitic PNP bipolar junction transistor and the first parasitic silicon-controlled rectifier.

Figure 5:
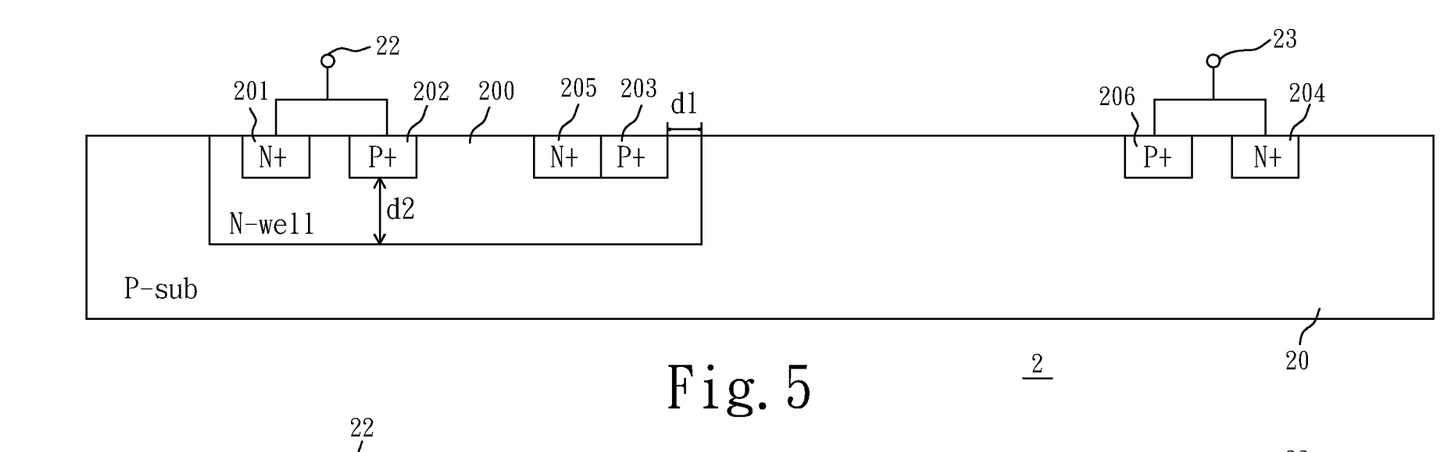
FIG. 5 is a cross-sectional view of a transient voltage suppression device according to a third embodiment of the present invention.

FIG. 5 is a cross-sectional view of a transient voltage suppression device according to a third embodiment of the present invention. Referring to FIG. 5, the third embodiment of the transient voltage suppression device 2 is introduced as follows. The third embodiment is different from the second embodiment in that the third embodiment further includes a third P-type heavily-doped area 206 formed in the P-type semiconductor layer 20 and coupled to the second pin 23. The third P-type heavily-doped area 206 provides the voltage of the second pin 23 for the P-type semiconductor layer 20 to increase the speed of turning on the first parasitic silicon-controlled rectifier.

Figure 6:
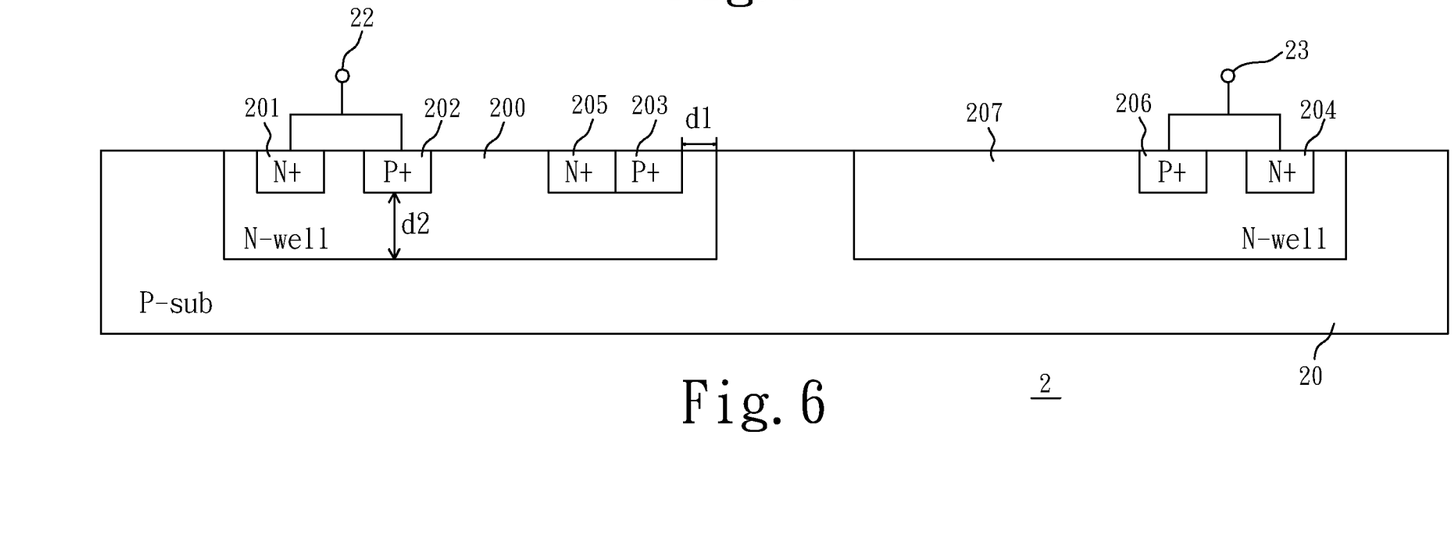
FIG. 6 is a cross-sectional view of a transient voltage suppression device according to a fourth embodiment of the present invention.

FIG. 6 is a cross-sectional view of a transient voltage suppression device according to a fourth embodiment of the present invention. Referring to FIG. 6, the fourth embodiment of the transient voltage suppression device 2 is introduced as follows. The fourth embodiment is different from the third embodiment in that the fourth embodiment further includes a second N-type well 207 formed in the P-type semiconductor layer 20. The second N-type heavily-doped area 204 and the third P-type heavily-doped area 206 are formed in the second N-type well 207. The second N-type heavily-doped area 204 provides the voltage of the second pin 23 for the second N-type well 207.

When a positive electrostatic discharge (ESD) voltage is applied to the first pin 22 and the second pin 23 is grounded, a ESD current sequentially flows through the first P-type heavily-doped area 202, the first N-type well 200, the P-type semiconductor layer 20, the second N-type well 207, and the second N-type heavily-doped area 204. Simultaneously, the first parasitic PNP bipolar junction transistor can help trigger on the first parasitic silicon-controlled rectifier. When a positive electrostatic discharge (ESD) voltage is applied to the second pin 23 and the first pin 22 is grounded, a ESD current sequentially flows through the third P-type heavily-doped area 206, the second N-type well 207, the P-type semiconductor layer 20, the first N-type well 200, and the first N-type heavily-doped area 201. Simultaneously, a second parasitic silicon-controlled rectifier formed by the third P-type heavily-doped area 206, the second N-type well 207, the P-type semiconductor layer 20, the first N-type well 200, and the first N-type heavily-doped area 201 is turned on.

Figure 7:
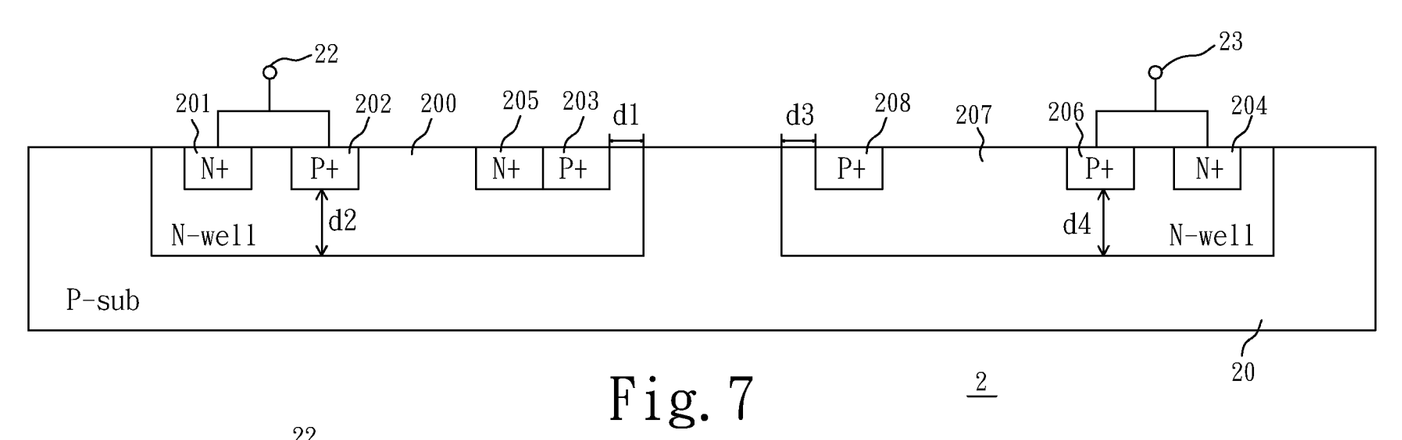
FIG. 7 is a cross-sectional view of a transient voltage suppression device according to a fifth embodiment of the present invention.

FIG. 7 is a cross-sectional view of a transient voltage suppression device according to a fifth embodiment of the present invention. Referring to FIG. 7, the fifth embodiment of the transient voltage suppression device 2 is introduced as follows. The fifth embodiment is different from the fourth embodiment in that the fifth embodiment further includes a fourth P-type heavily-doped area 208 formed within the second N-type well 207 and spaced from the sidewall of the second N-type well 207. The fourth P-type heavily-doped area 208 is floating. The fourth P-type heavily-doped area 208 is formed between the third P-type heavily-doped area 206 and the first N-type heavily-doped area 201. The third P-type heavily-doped area 206 is spaced from the bottom of the second N-type well 207. The fourth P-type heavily-doped area 208, the second N-type well 207, and the P-type semiconductor layer 20 form a third parasitic PNP bipolar junction transistor.

When a positive electrostatic discharge (ESD) voltage is applied to the second pin 23 and the first pin 22 is grounded, a ESD current sequentially flows through the third P-type heavily-doped area 206, the second N-type well 207, the P-type semiconductor layer 20, the first N-type well 200, and the first N-type heavily-doped area 201. Simultaneously, the third parasitic PNP bipolar junction transistor can help trigger on the second parasitic silicon-controlled rectifier. Since the ESD current does not flow through the second N-type heavily-doped area 204, the series resistance of the breakdown path where the ESD current flows can be reduced. Besides, since the fourth P-type heavily-doped area 208 separates from the sidewall of the second N-type well 207, a junction capacitance formed by the P-type semiconductor layer 20 and the second N-type well 207 is lower than the junction capacitance formed by the P-type semiconductor layer 10 and the N-type heavily-doped area 16 of FIG. 1. As a result, the ESD protection effect of the transient voltage suppression device 2 can be improved.

The fourth P-type heavily-doped area 208 is a third distance d3 from the sidewall of the second N-type well 207. The third P-type heavily-doped area 206 is a fourth distance d4 from the bottom of the second N-type well 207. The third distance d3 is the width of the base of the third parasitic PNP bipolar junction transistor. The breakdown voltage of the third parasitic PNP bipolar junction transistor depends on the third distance d3. The trigger voltage of the second parasitic silicon-controlled rectifier depends on the breakdown voltage of the third parasitic PNP bipolar junction transistor. The shorter the third distance d3, the smaller the trigger voltage of the second parasitic silicon-controlled rectifier.

The third P-type heavily-doped area 206, the second N-type well 207, and the P-type semiconductor layer 20 form a fourth parasitic PNP bipolar junction transistor. The fourth distance d4 is the width of the base of the fourth parasitic PNP bipolar junction transistor. The breakdown voltage of the fourth parasitic PNP bipolar junction transistor depends on the fourth distance d4. In some embodiments of the present invention, the third distance d3 between the fourth P-type heavily-doped area 208 and the sidewall of the second N-type well 207 is less than the fourth distance d4 between the third P-type heavily-doped area 206 and the bottom of the second N-type well 207. As a result, the speed of turning on the third parasitic PNP bipolar junction transistor is higher than the speed of turning on the fourth parasitic PNP bipolar junction transistor, such that the speed of turning on the second parasitic silicon-controlled rectifier is increased.

The first distance d1 between the second P-type heavily-doped area 203 and the sidewall of the first N-type well 200 is equal or unequal to the third distance d3 between the fourth P-type heavily-doped area 208 and the sidewall of the second N-type well 207. The first distance d1 and the third distance d3 are adaptable according to requirements. The second distance d2 between the first P-type heavily-doped area 202 and the bottom of the first N-type well 200 is equal or unequal to the fourth distance d4 between the third P-type heavily-doped area 206 and the bottom of the second N-type well 207. The second distance d2 and the fourth distance d4 are adaptable according to requirements. If the first distance d1 and the third distance d3 are equal and the second distance d2 and the fourth distance d4 are equal, the I-V curve of the first parasitic silicon-controlled rectifier is symmetric to that of the second parasitic silicon-controlled rectifier.

Figure 8:
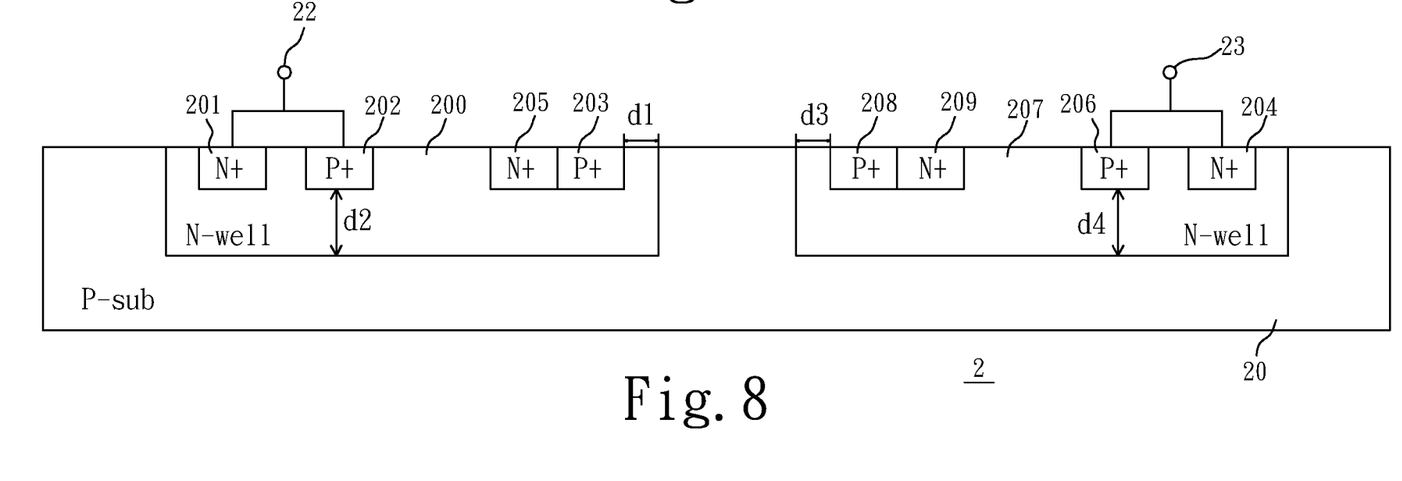
FIG. 8 is a cross-sectional view of a transient voltage suppression device according to a sixth embodiment of the present invention.

FIG. 8 is a cross-sectional view of a transient voltage suppression device according to a sixth embodiment of the present invention. Referring to FIG. 8, the sixth embodiment of the transient voltage suppression device 2 is introduced as follows. The sixth embodiment is different from the fifth embodiment in that the sixth embodiment further includes a fourth N-type heavily-doped area 209 formed within the second N-type well 207. The fourth N-type heavily-doped area 209 is floating and directly adjacent to the fourth P-type heavily-doped area 208. In other words, there is nothing between the fourth N-type heavily-doped area 209 and the fourth P-type heavily-doped area 208. The fourth N-type heavily-doped area 209 is formed between the third P-type heavily-doped area 206 and the fourth P-type heavily-doped area 208. When the positive ESD voltage is applied to the second pin 23 and the first pin 22 is grounded, the fourth N-type heavily-doped area 209 can generate a drift current to increase the speed of turning on the third parasitic PNP bipolar junction transistor and the second parasitic silicon-controlled rectifier.

Figure 9:
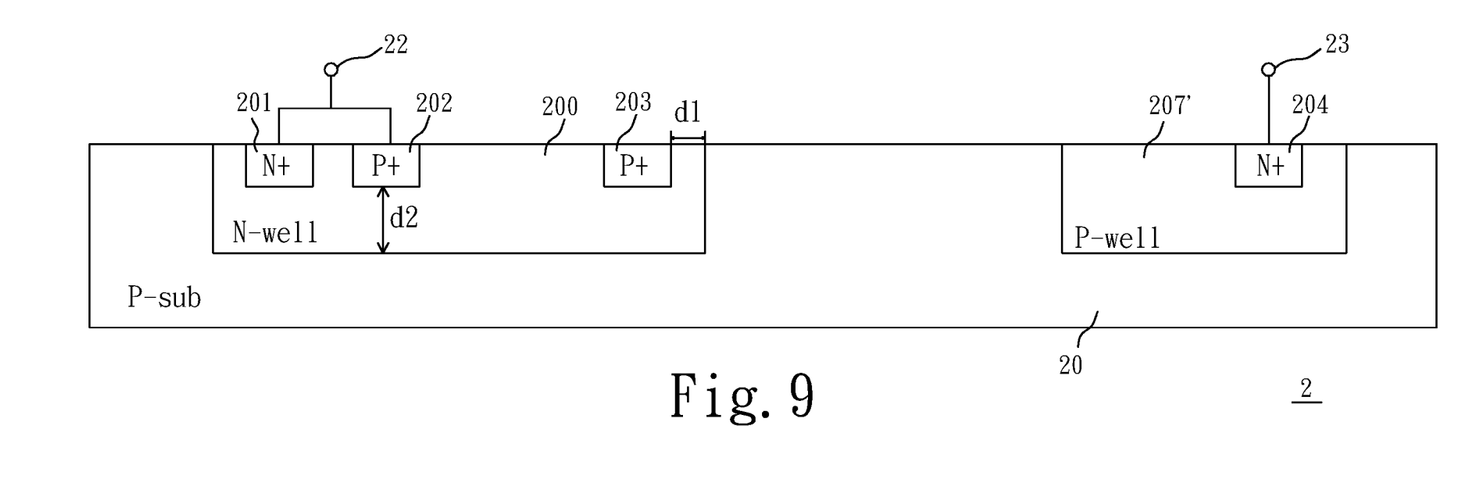
FIG. 9 is a cross-sectional view of a transient voltage suppression device according to a seventh embodiment of the present invention.

FIG. 9 is a cross-sectional view of a transient voltage suppression device according to a seventh embodiment of the present invention. Referring to FIG. 9, the seventh embodiment of the present invention is introduced as follows. The seventh embodiment is different from the first embodiment in that the seventh embodiment further includes a P-type well 207' formed in the P-type semiconductor layer 20. The second N-type heavily-doped area 204 is formed in the P-type well 207'. The first P-type heavily-doped area 202, the first N-type well 200, the P-type semiconductor layer 20, the P-type well 207', and the second N-type heavily-doped area 204 form a first parasitic silicon-controlled rectifier. The second P-type heavily-doped area 203, the first N-type well 200, and the P-type semiconductor layer 20 form a first parasitic PNP bipolar junction transistor.

When a positive electrostatic discharge (ESD) voltage is applied to the first pin 22 and the second pin 23 is grounded, a ESD current sequentially flows through the first P-type heavily-doped area 202, the first N-type well 200, the P-type semiconductor layer 20, the P-type well 207', and the second N-type heavily-doped area 204. Simultaneously, the first parasitic PNP bipolar junction transistor can help trigger on the first parasitic silicon-controlled rectifier. Since the ESD current does not flow through the first N-type heavily-doped area 201, the series resistance of the breakdown path where the ESD current flows can be reduced. Besides, since the second P-type heavily-doped area 203 separates from the sidewall of the first N-type well 200, a junction capacitance formed by the P-type semiconductor layer 20 and the first N-type well 200 is lower than the junction capacitance formed by the P-type semiconductor layer 10 and the N-type heavily-doped area 16 of FIG. 1. As a result, the ESD protection effect of the transient voltage suppression device 2 can be improved.

Figure 10:
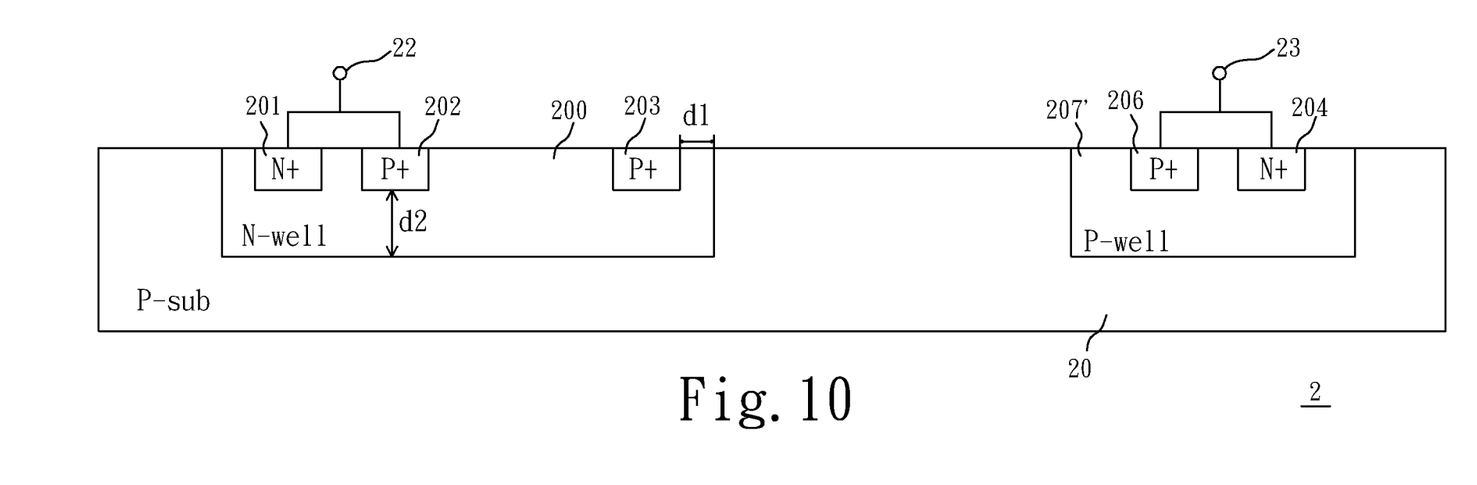
FIG. 10 is a cross-sectional view of a transient voltage suppression device according to an eighth embodiment of the present invention.

FIG. 10 is a cross-sectional view of a transient voltage suppression device according to an eighth embodiment of the present invention. Referring to FIG. 10, the eighth embodiment of the present invention is introduced as follows. The eighth embodiment is different from the seventh embodiment in that the eighth embodiment further includes a third P-type heavily-doped area 206 formed in the P-type well 207' and coupled to the second pin 23. The third P-type heavily-doped area 206 provides the voltage of the second pin 23 for the P-type well 207' to increase the speed of turning on the first parasitic silicon-controlled rectifier.

According to the embodiments provided above, the transient voltage suppression device forms the second P-type heavily-doped area within the first N-type well and separates the second P-type heavily-doped area from the sidewall of the first N-type well to reduce the capacitance of the parasitic silicon-controlled rectifier. The transient voltage suppression device also connects the first N-type heavily-doped area and the second P-type heavily-doped area within the N-type well to reduce the series resistance of the breakdown path. Thus, the transient voltage suppression device improves the ESD protection effect.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A transient voltage suppression device comprising:
   a P-type semiconductor layer;
   a first N-type well formed in the P-type semiconductor layer;
   a first N-type heavily-doped area and a first P-type heavily-doped area formed in the first N-type well and commonly coupled to a first pin, wherein the first P-type heavily-doped area is spaced from a bottom of the first N-type well;
   a second P-type heavily-doped area formed within the first N-type well and spaced from a sidewall of the first N-type well, wherein the second P-type heavily-doped area is floating; and
   a second N-type heavily-doped area formed in the P-type semiconductor layer and coupled to a second pin, wherein the second P-type heavily-doped area is formed between the first P-type heavily-doped area and the second N-type heavily-doped area;
   wherein a first distance between the second P-type heavily-doped area and the sidewall of the first N-type well is less than a second distance between the first P-type heavily-doped area and the bottom of the first N-type well.

2. The transient voltage suppression device according to claim 1, further comprising a third N-type heavily-doped area formed within the first N-type well, wherein the third N-type heavily-doped area is floating and directly adjacent to the second P-type heavily-doped area, and the third N-type heavily-doped area is formed between the first P-type heavily-doped area and the second P-type heavily-doped area.

3. The transient voltage suppression device according to claim 2, further comprising a third P-type heavily-doped area formed in the P-type semiconductor layer and coupled to the second pin.

4. The transient voltage suppression device according to claim 3, further comprising a second N-type well formed in the P-type semiconductor layer, wherein the second N-type heavily-doped area and the third P-type heavily-doped area are formed in the second N-type well.

5. The transient voltage suppression device according to claim 4, further comprising a fourth P-type heavily-doped area formed within the second N-type well and spaced from a sidewall of the second N-type well, wherein the fourth P-type heavily-doped area is floating, the fourth P-type heavily-doped area is formed between the third P-type heavily-doped area and the first N-type heavily-doped area, and the third P-type heavily-doped area is spaced from a bottom of the second N-type well.

6. The transient voltage suppression device according to claim 5, wherein a third distance between the fourth P-type heavily-doped area and the sidewall of the second N-type well is less than a fourth distance between the third P-type heavily-doped area and the bottom of the second N-type well.

7. The transient voltage suppression device according to claim 5, further comprising a fourth N-type heavily-doped area formed within the second N-type well, wherein the fourth N-type heavily-doped area is floating and directly adjacent to the fourth P-type heavily-doped area, and the fourth N-type heavily-doped area is formed between the third P-type heavily-doped area and the fourth P-type heavily-doped area.

8. The transient voltage suppression device according to claim 5, wherein a distance between the second P-type heavily-doped area and the sidewall of the first N-type well is equal to a distance between the fourth P-type heavily-doped area and the sidewall of the second N-type well.

9. The transient voltage suppression device according to claim 5, wherein a distance between the first P-type heavily-doped area and the bottom of the first N-type well is equal to a distance between the third P-type heavily-doped area and the bottom of the second N-type well.

10. The transient voltage suppression device according to claim 1, wherein the P-type semiconductor layer is a P-type semiconductor substrate or a P-type epitaxial layer.

11. The transient voltage suppression device according to claim 1, further comprising a P-type well formed in the P-type semiconductor layer, and the second N-type heavily-doped area is formed in the P-type well.

12. The transient voltage suppression device according to claim 11, further comprising a third P-type heavily-doped area formed in the P-type well and coupled to the second pin.

* * * * *